United States Patent [19]
Shimpuku et al.

[11] Patent Number: 5,528,236
[45] Date of Patent: Jun. 18, 1996

[54] MODULATING METHOD, DEMODULATING METHOD, MODULATING APPARATUS, AND DEMODULATING APPARATUS

[75] Inventors: Yoshihide Shimpuku; Toshiyuki Nakagawa, both of Kanagawa, Japan

[73] Assignee: Sony Corporation, Tokyo, Japan

[21] Appl. No.: 213,234

[22] Filed: Mar. 15, 1994

[30] Foreign Application Priority Data

Mar. 22, 1993 [JP] Japan .................. 5-062238

[51] Int. Cl.$^6$ ............................ H03M 7/46
[52] U.S. Cl. ........................ 341/59; 341/106
[58] Field of Search ............... 341/59, 58, 87, 341/53, 110

[56] References Cited

U.S. PATENT DOCUMENTS

| | | | |
|---|---|---|---|
| 3,689,899 | 9/1972 | Franaszek | 340/172.5 |
| 4,348,659 | 9/1982 | Fujimori et al. | 340/347 |
| 4,914,438 | 4/1990 | Kameyama | 341/59 |
| 4,985,700 | 1/1991 | Mikami | 341/59 |
| 5,034,742 | 7/1991 | Bond et al. | 341/67 |
| 5,062,011 | 10/1991 | Hase et al. | 360/40 |
| 5,138,314 | 8/1992 | Shimpuku et al. | 341/58 |
| 5,138,316 | 8/1992 | Konishi | 341/67 |
| 5,173,694 | 12/1992 | Lynch, Jr. et al. | 341/59 |
| 5,264,847 | 11/1993 | Bhandari | 341/81 |
| 5,365,231 | 11/1994 | Niimura | 341/58 |
| 5,388,993 | 2/1995 | McKiel et al. | 434/118 |
| 5,400,023 | 3/1995 | Ino et al. | 341/59 |

FOREIGN PATENT DOCUMENTS

| | | | |
|---|---|---|---|
| 0314512A2 | 5/1989 | European Pat. Off. | G11B 20/14 |
| 0329533A1 | 8/1989 | European Pat. Off. | H03M 7/40 |
| 0442548A1 | 8/1991 | European Pat. Off. | H03M 7/40 |
| 0455267A3 | 11/1991 | European Pat. Off. | G11B 20/14 |
| 0467678A2 | 1/1992 | European Pat. Off. | H03M 7/42 |
| 0560339A1 | 9/1993 | European Pat. Off. | H03M 7/40 |
| 0577402A2 | 1/1994 | European Pat. Off. | G11B 20/10 |
| 3502808A1 | 8/1987 | Germany | H03M 7/40 |

*Primary Examiner*—A. D. Pellinen
*Assistant Examiner*—Peguy JeanPierre
*Attorney, Agent, or Firm*—Limbach & Limbach; Philip M. Shaw, Jr.

[57] ABSTRACT

A modulating system for converting data of a basic data length of m bits into a variable length code (d, k; m, n; r) of a basic code length of n bits, which comprises the steps of: judging a binding length i (i=1~r) of the basic data; uniformly converting data of m×i bits into a code of n×r bits by using a conversion table for converting data of m×r bits where the binding length i is the maximum binding length r, and including at least one conversion table where the binding length i is less than r; and taking out specific bits from the code of n×r bits thus obtained on the basis of the judged binding length i to output them as a modulation code. There is also a demodulating system for converting, in reverse direction, a variable length code (d, k; m, n; r) of a basic code length of n bits into data of a basic data length of m bits, comprising the steps of: judging a binding length i of the variable length code; uniformly converting, in reverse direction, a variable length code of n×i bits into data of m×r bits by a reverse conversion table for converting, in reverse direction, a variable length code of n×r bits where the binding length i is the maximum binding length r, and including at least one reverse conversion table where the binding length i is less than r; and taking out specific bits from data thus obtained on the basis of the judged binding length i to output it as reproduction data.

14 Claims, 5 Drawing Sheets

MODULATING METHOD, DEMODULATING METHOD, MODULATING APPARATUS, AND DEMODULATING APPARATUS

BACKGROUND OF THE INVENTION

FIELD OF THE INVENTION

This invention relates to a modulating method, a demodulating method, a modulating apparatus, and a demodulating apparatus, and more particularly to a modulating method and a modulating apparatus for modulating data so that it is suitable for data transmission, or recording onto a recording medium, and a demodulating method and a demodulating apparatus for demodulating a modulation code obtained by modulation to reproduce data.

BACKGROUND ART

In transmitting data, or recording data onto a recording medium, e.g., a magnetic disc or an optical disc, etc., modulation of data is carried out so that it is suitable for transmission or recording. As one type of modulation block coding is known. In accordance with this block coding, a data train is divided into blocks in units of m×i bits (hereinafter referred to as a data word) to convert them into code words comprised of n×i bits in accordance with a suitable code rule. When i=1, block code is a fixed length code. On the other hand, when a plurality of i are selected, i.e., i≧1 and conversion is made by $i_{max}$=r which is the maximum i, block code is a variable length code. A code which has undergone block coding is called a variable length code (d, k; m, n; r). Here i is called a binding length, and binding length $i_{max}$ is r (hereinafter referred to as the maximum binding length r). Further, d indicates the minimum continuous numbers of the same symbols, i.e., so called minimum run of, e.g., 0, and k indicates the maximum continuous numbers of the same symbols, i.e., the maximum run of, e.g., 0.

Meanwhile, in the case of recording a variable length code obtained as described above onto, e.g., an optical disc, etc., the variable length code is further subjected to so called NRZI (Non Return to Zero Inverted) modulation to carry out recording on the basis of the NRZI modulated variable length code (hereinafter referred to as a recording waveform train). When it is now assumed that the minimum reversal interval of the recording waveform train is $T_{min}$ and the maximum reversal interval thereof is $T_{max}$, it is desirable that the minimum reversal interval $T_{min}$ be large, i.e., that the minimum run d be long from a viewpoint of the recording density. Various modulating systems have been proposed. It is to be noted that according as the maximum reversal interval $T_{max}$ becomes smaller, more satisfactory results are obtained from the viewpoint of reproduction of clock or so called jitter.

In a more practical sense, in so called a compact disc (CD) on which audio data is recorded, so called EFM (Eight to Fourteen Modulation) is used. This EFM corresponds to code (2, 10; 8, 17; 1). Assuming now that the bit interval of a data train is T, the minimum reversal interval $T_{min}$ is equal to 1.41 (=(8/17)×3)T. Further, the detecting window width $T_W$ which gives allowed value of jitter is indicated by (m/n)×T, and its value is equal to 0.47 (=(8/17) T. In such a CD, it is conceivable to shorten the minimum pit length corresponding to the minimum reversal interval $T_{min}$ formed on the disk to enhance the recording density. However, when the minimum pit length is much smaller than the spot size of a laser beam, it becomes difficult to detect pits, resulting in the cause of occurrence of error. In view of this, it is conceivable to cause the spot size to be smaller by shortening the wavelength of a laser light source, or the like thus to allow the density to be higher. However, there is a limitation in implementing such an approach. Namely, it is difficult to carry out recording of data which is greater by six times than that of the existing system, such as, for example, record of video data of a moving picture onto a CD having a diameter of 12 cm.

Accordingly, it is important to employ a modulating system permitting the minimum pit length formed on an optical disc, i.e., the minimum reversal interval $T_{min}$ without reducing information quantity. In such a modulating system, however, there was the problem that the above-described maximum binding length r becomes greater, i.e., the conversion table for converting data into a variable length code is increased in size, resulting in an increased circuit scale.

As stated above, for the purpose of allowing the density of a recording medium such as an optical disc, etc. to be higher, it is necessary to cause the minimum reversal interval $T_{min}$ of a variable length code obtained by modulation, i.e., the minimum run d to be greater. However, if such an approach is carried out without reducing information quantity, there was the problem that the conversion table is increased in size, so the circuit scale becomes large. In addition, also with respect to reverse conversion table for demodulating a variable length code obtained by reproducing, e.g., a recording medium to reproduce data, there was similar problem.

OBJECT AND SUMMARY OF THE INVENTION

With actual circumstances as described above in view, an object of this invention is to provide a modulating method, a demodulating method, a modulating apparatus, and a demodulating apparatus which permit a conversion table for modulating, or reverse conversion table for demodulation to be smaller than that of the conventional system, thus making it possible to cause the circuit scale to become more compact than that of the conventional system. It should be noted that this application is an improved invention of U.S. Pat. No. 5,400,023 by the same applicant.

To achieve the above-described object, in accordance with this invention, there is provided a modulating method for converting data of a basic data length of m bits into a variable length code of a basic (block) code length of n bits (d, k; m, n; r), comprising: a judging step of judging a binding length i (i=1~r) of the basic data; a modulating step of uniformly converting data of m×i bits into a code of n×i bits by a conversion table for converting data of m×r bits where the binding length i is the maximum binding length r, and including at least one conversion table where the binding length i is less than r; and a code generating step of taking out specific bits from the code obtained at the modulating step on the basis of the binding length i obtained at the judging step to output them as a modulation code.

At the code generating step, n×i bits from the least significant bit may be taken out as the specific bits based on the binding length i from the code obtained at the modulating step.

Further, in converting data where the binding length i is less than r at the modulating step, this step includes data converting sub-step of converting a portion of the data so that it is in correspondence with a data portion of the conversion table.

The above-mentioned variable length code (d, k; m, n; r) is such that the minimum run d of "0" symbols is four or more.

The above-mentioned variable length code (d, k; m, n; r) is such that the maximum run k of "0" symbols is 22 or less.

Further, in accordance with this invention, there is provided a demodulating method for converting, in reverse direction, a variable length code (d, k; m, n; r) of a basic code length of n bits into data of a basic data length of m bits, comprising: a judging step of judging a binding length i of the variable length code; a demodulating step of uniformly converting, in reverse direction, a variable length code of n×i bits into data of m×r bits by a reverse conversion table for converting, in reverse direction, a variable length code of n×r bits where the binding length i is the maximum binding length r, and including at least one reverse conversion table where the binding length i is less than r; and a data generating step of taking out specific bits from data obtained at the demodulating step on the basis of the binding length i obtained at the judging step to output them as reproduction data.

At the data generating step, m×i bits from the least significant bit may be taken out as specific bits based on the binding length i from data obtained at the demodulating step.

At the judging step, a variable length code train is partitioned in units of n bits from the leading portion thereof, whereby when n bits of one unit are all "0", it is judged that there is a boundary of the variable length code, thus to judge binding length i.

After a variable length code where the binding length i is less than r is converted in the reverse direction at the demodulating step, specific bits of the data of m×i bits which have been taken out are converted into reproduction data at the data generating step.

Further, a first modulating apparatus according to this invention is directed to a modulating apparatus for converting data of a basic data length of m bits into a variable length code (d, k; m, n; r) of a basic code length of n bits, comprising: judging means for judging a binding length i (i=1~r); first modulating means for uniformly converting data of m×i bits into a code of n×r bits by a first conversion table for converting data of m×r bits where the binding length i is the maximum binding length r, and including at least one conversion table where the binding length i is less than r; code generating means for taking out specific bits from the code from the first modulating means on the basis of the binding length i from the judging means to output them as a modulation code; and second modulating means for converting m×i bits which cannot be converted at the first modulating means into a variable length code of n×i bits by a second conversion table for converting data of the binding length i which is not included in the first conversion table to output it as a modulation code.

A second demodulating apparatus according to this invention is characterized in that, in the first modulating apparatus, the code generating means takes out n×i bits from the least significant bit as specific bits based on the binding length i from the code from the first modulating means.

Further, a third modulating apparatus according to this invention is characterized in that, in the second demodulating apparatus, in converting data where the binding length i is less than r by the first modulating means, there is provided data converting means for converting a portion of data so as to become in correspondence with the data portion of the first conversion table.

Further, a fourth modulating apparatus according to this invention is characterized in that, in the third modulating apparatus, the variable length code (d, k; m, n; r) is such that the minimum run d of "0" symbols is 4 or more.

In addition, a fifth modulating apparatus according to this invention is characterized in that, in the third modulating apparatus, the variable length code (d, k; m, n; r) is such that the minimum run d of "0" symbols is 4 or more, and the maximum run k of "0" symbols is 22 or less.

Furthermore, in accordance with this invention, there is provided a first demodulating apparatus for converting, in reverse direction, a variable length code (d, k; m, n; r) of a basic code length of n bits into data of a basic data length of m bits, comprising: judging means for judging the binding length i of the variable length code; first demodulating means for uniformly converting, in reverse direction, a variable length code of n×i bits into data of m×r bits by a first reverse conversion table for converting, in reverse direction, a variable length code of n×r bits where the binding length i is the maximum binding length r, and including at least one reverse conversion table where the binding length i is less than r; data generating means for taking out specific bits from data from the first demodulating means on the basis of the binding length i from the judging means to output them as reproduction data; and second demodulating means for converting, in reverse direction, the variable length code of n×i bits which cannot be converted in reverse direction at the first demodulating means into data of m×i bits by a second reverse conversion table for converting, in reverse direction, a variable length code of the binding length i, which is not included in the first reverse conversion table, thus to output it as reproduction data.

A second demodulating apparatus according to this invention is characterized in that, in the first demodulating apparatus, the data generating means takes out m×i bits from the least significant bit as specific bits based on the binding length i from data from the first demodulating means.

A third demodulating apparatus according to this invention is characterized in that, in the first demodulating apparatus, the judging means is adapted to partition a variable length code train in units of n bits from the leading portion thereof, whereby when n bits of one unit are all "0" symbols, it is judged that there is a boundary of the variable length code to judge the binding length i.

Further, a fourth demodulating apparatus according to this invention is characterized in that, in the second demodulating apparatus, in converting, in reverse direction, a variable length code where the binding length i is less than r, the data generating means converts specific bits of data of n×i bits which have been taken out to take it as reproduction data.

In accordance with this invention, the binding length i (i=1~r) of data is judged to uniformly convert data of m×i bits into a code of n×r bits by the first conversion table to take out specific bits on the basis of the binding length i from this code to output it as a modulation code, and to convert data of m×i bits which cannot be converted by the first conversion table into a variable length code of n×i bits by the second conversion table to output it as a modulation code.

Further, in accordance with this invention, n×i bits from the least significant bit are taken out as specific bits based on the binding length i from the code to output it as a modulation code.

Further, in accordance with this invention, in converting data where the binding length i is less than r by the first conversion table, a portion of data is converted so as to become in correspondence with the data portion of the first conversion table to uniformly convert data of m×i bits into a code of n×r bits.

Further, in accordance with this invention, data of m×i bits is converted into a variable length code of n×r bits with the variable length code (d, k; m, n; r) being such that the minimum run d of "0" symbols is caused to be four or more.

Further, in accordance with this invention, by setting the variable length code (d, k; m, n; r) so that the minimum run d of "0" symbols is four or more and the maximum run k of "0" symbols is 22 or less, data of m×i bits is converted into a variable length code of n×r bits.

Further, in accordance with this invention, the binding length i of the variable length code is judged to uniformly convert, in reverse direction, a variable length code of n×i bits into data of m×r bits by the first reverse conversion table to take out specific bits on the basis of the binding length i from this data to output it as reproduction data, and to convert in reverse direction a variable length code of n×i bits which cannot be converted in reverse direction by the first inversion table into data of m×i bits by the second reverse conversion table to output it as reproduction data.

Further, in accordance with this invention, m×i bits from the least significant bit are taken out as specific bits based on the binding length i from data to output it as reproduction data.

Further, in accordance with this invention, a variable length code train is partitioned in units of n bits from the leading portion thereof, whereby when n bits of one unit are all "0" symbols, it is judged that there is a boundary of the variable length code to judge the binding length i.

In addition, in accordance with this invention, in converting in reverse direction a variable length code where the binding length i is less than r by the first reverse conversion table, specific bits of data of n×i bits which have been taken out are converted to output them as reproduction data.

DESCRIPTION OF THE PREFERRED EMBODIMENT

Figure 1:
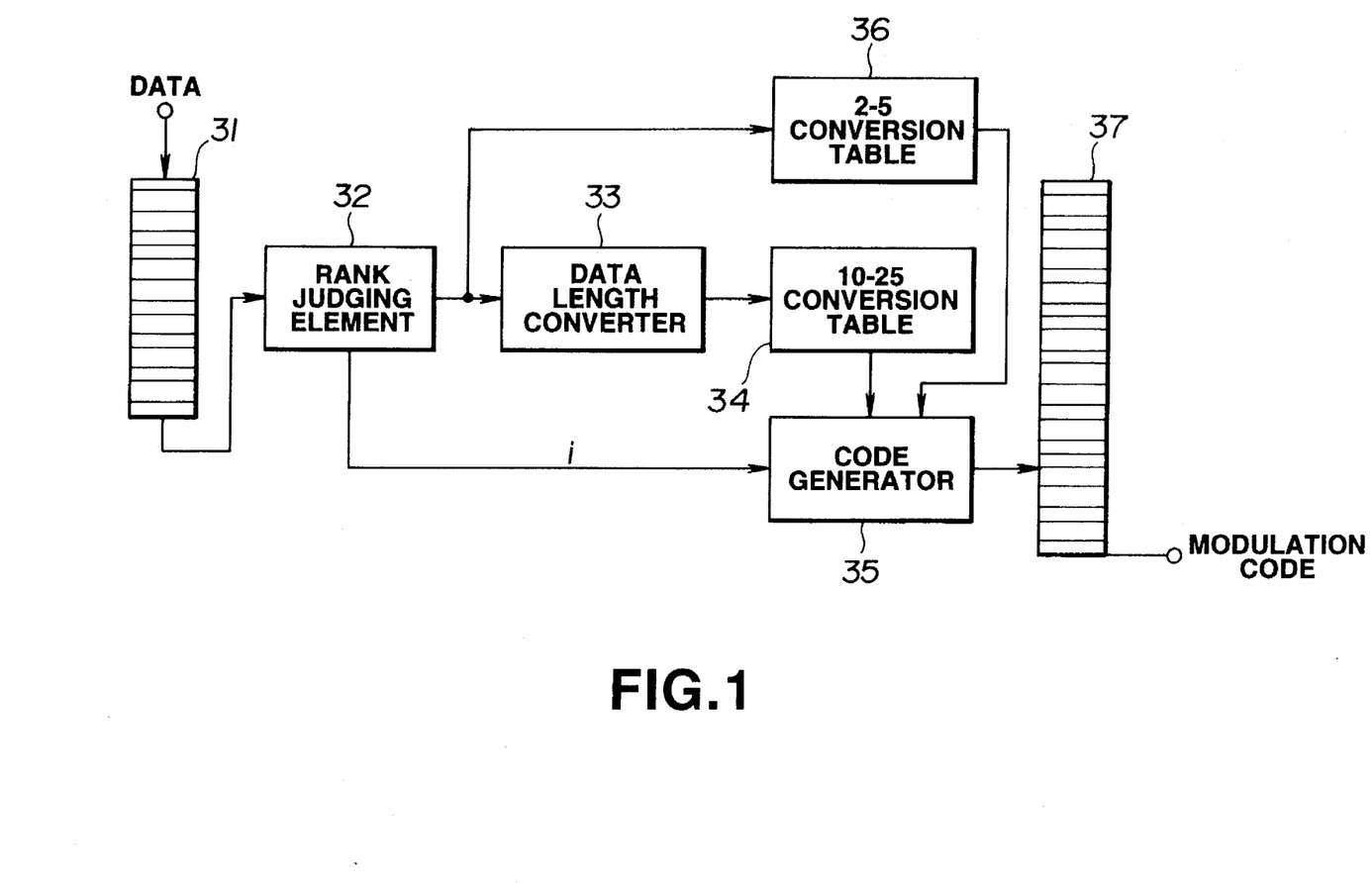
FIG. 1 is a block diagram showing a circuit configuration of a recording/reproducing system using a modulating apparatus and a demodulating apparatus to which this invention is applied.
Figure 2:
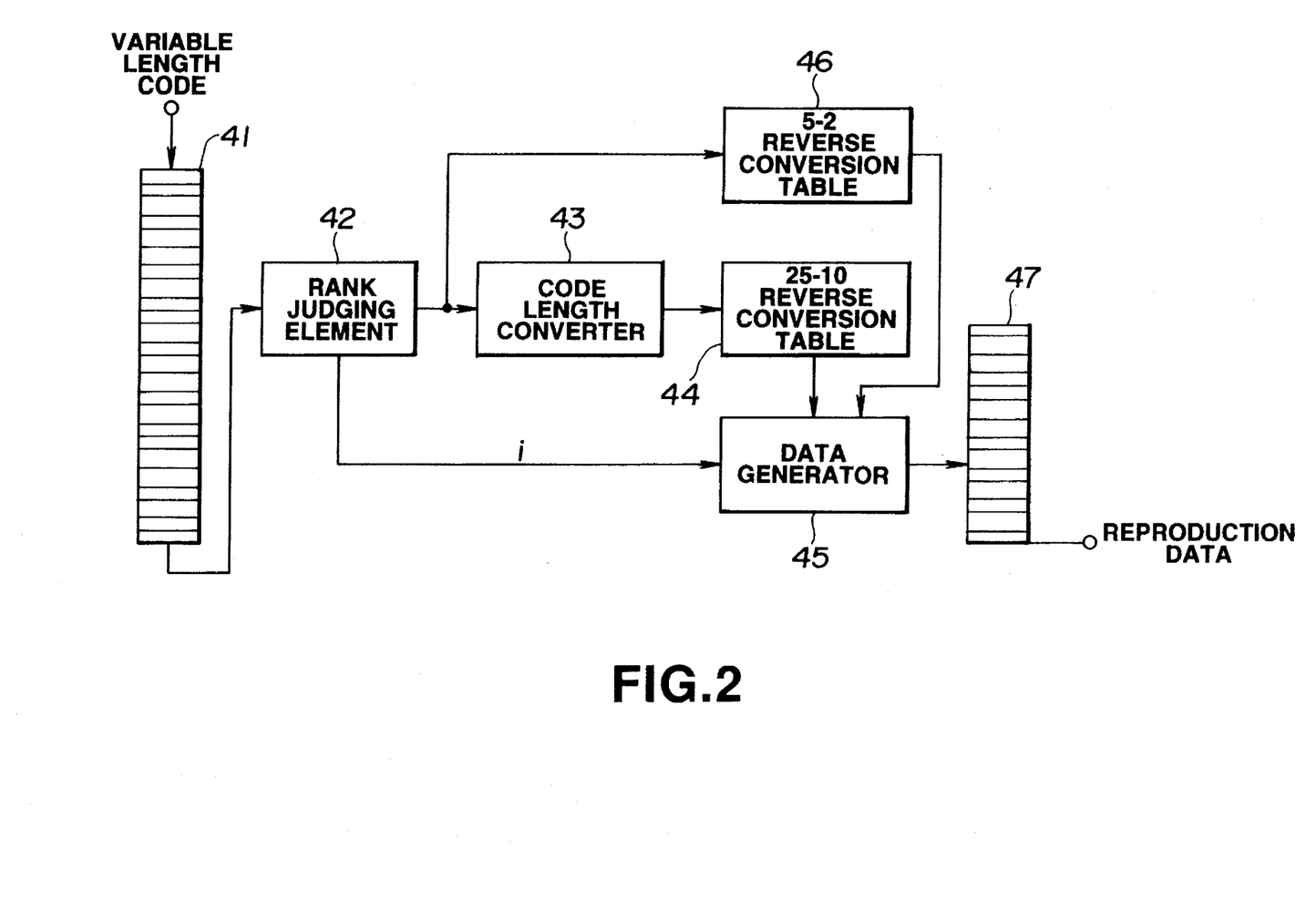
FIG. 2 is a block diagram showing an actual circuit configuration of the modulating apparatus to which this invention is applied.

A preferred embodiment of a modulating method, a demodulating method, a modulating apparatus, and a demodulating apparatus will now be described with reference to the attached drawings. In this embodiment, this invention is applied to a modulating apparatus for converting data into a variable length code (d, k; m, n; r) and a demodulating device for carrying out conversion in reverse direction. FIG. 1 is a block diagram showing an actual circuit configuration of the modulating apparatus, FIG. 2 is a block diagram showing an actual circuit configuration of the demodulating apparatus, and FIG. 3 is a block diagram showing the circuit configuration of the entirety of a recording/reproducing system for recording a video signal or reproducing a recorded video signal by using the modulating apparatus and the demodulating apparatus.

First, the recording/reproducing system will now be described.

Figure 3:
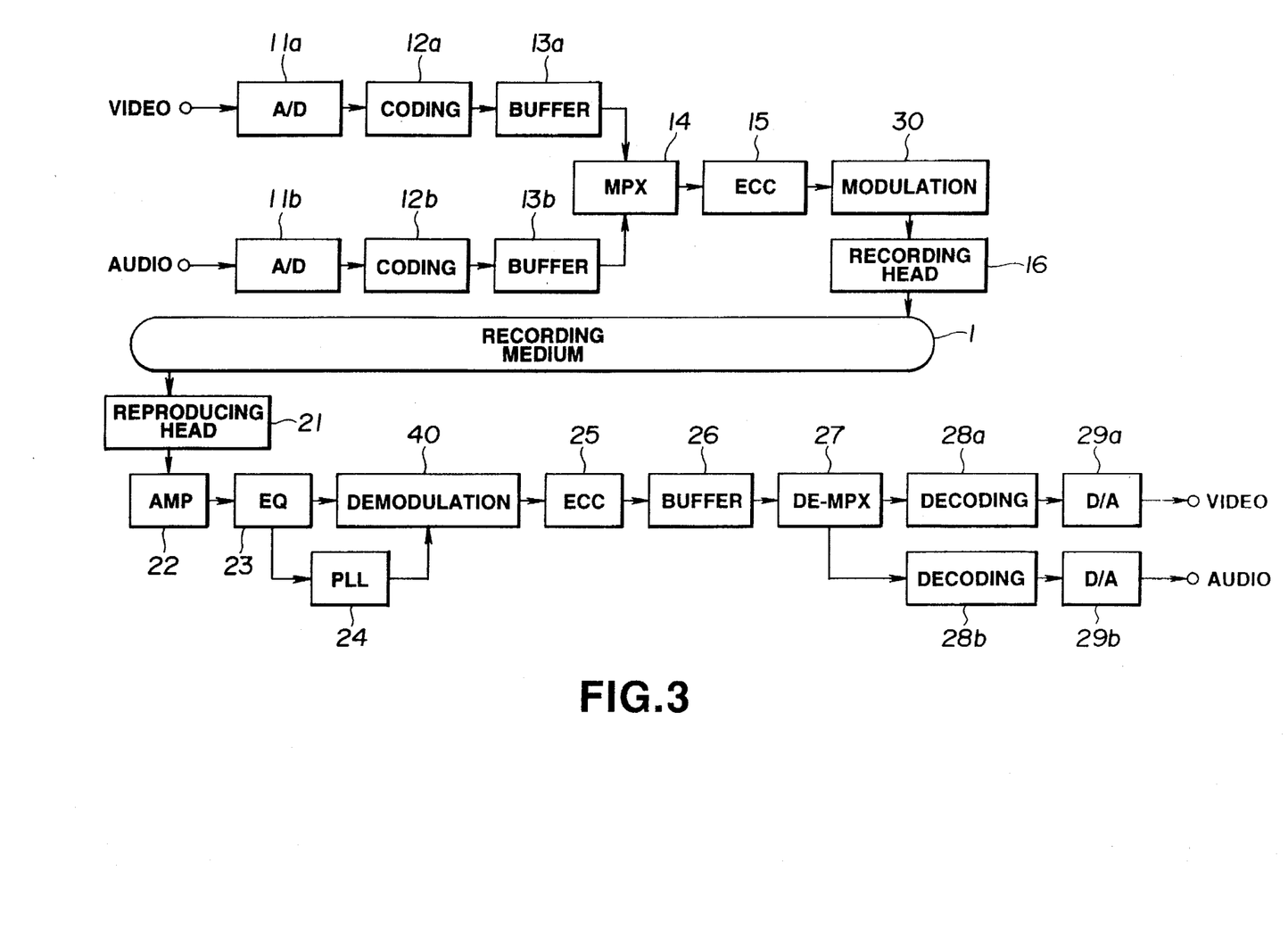
FIG. 3 is a block diagram showing an actual circuit configuration of the demodulating apparatus to which this invention is applied.

The recording system of the recording/reproducing system comprises, as shown in FIG. 3, an analog/digital converter (hereinafter referred to as A/D converter) 11a for converting a video signal to a digital signal, an encoder 12a for encoding the digital video signal from the A/D converter 11a to implement data compression thereto, a buffer memory 13a for storing video data from the encoder 12a, an A/D converter 11b for converting an audio signal to a digital signal, an encoder 12b for encoding the digital audio signal from the A/D converter 11b to implement data compression thereto, a buffer memory 13b for storing audio data from the encoder 12b, a multiplexer (hereinafter referred to as MPX) 14 for multiplexing video data and audio data from the buffer memories 13a, 13b, a circuit for adding an error correcting code (ECC) to data from the MPX 14 (hereinafter referred to as ECC circuit) 15, a modulating unit 30 for modulating the data to which the error correcting code from the ECC circuit 15 is added, and a recording head 16 for carrying out recording onto a recording medium 1 on the basis of a modulation code from the modulating unit 30.

In operation, the A/D converter 11a converts a video signal delivered as an analog signal into a digital video signal. The encoder 12a is comprised of, e.g., so called a predictive encoder, a discrete cosine transform (so called DCT) element, or a Huffman encoder, etc. for carrying out a predetermined coding, and adapted to allow the digital video signal delivered from A/D converter 11a to undergo motion compensating predictive-coding between pictures to reduce redundancy in the time base (axis) direction, and to reduce redundancy in the spatial direction by DCT and Huffman coding to carry out efficient coding to generate video data. The video data thus generated is temporarily stored into the buffer memory 13a.

The A/D converter 11b converts an audio signal delivered as an analog signal into a digital audio signal. The encoder 12b is comprised of a predetermined encoder, and adapted to encode a digital audio signal delivered from the A/D converter 11b to implement data compression thereto to generate audio data. The audio data thus generated is temporarily stored into the buffer memory 13b.

The MPX 14 reads out video data stored in the buffer memory 13a and audio data stored in the buffer memory 13b, e.g., in a manner caused to be synchronized with each other to multiplex such data and add a synchronizing (SYNC) signal, etc. thereto to output it in accordance with a predetermined format.

The ECC circuit 15 adds an error correcting code to data in which video data and audio data are multiplexed from the MPX 14 to deliver the error correcting code added data to the modulating unit 30.

The modulating unit 30 converts data of a basic data length of m bits delivered from the MPX 14 into a variable length code (d, k; m, n; r) of a basic code length of n bits to allow the modulation code thus obtained to undergo, e.g., so called NRZI (Non Return to Zero Inverted) modulation to deliver it to recording head 16.

Meanwhile, the recording medium 1 is comprised of a recording medium such as an optical disc, a magnetic disc, or a magnetic tape, etc. The recording head 16 is comprised of an optical head or a magnetic head in correspondence with such a recording medium to carry out recording on the basis of a modulation code delivered from the modulating unit 30. For example, in the case where the recording medium 1 is assumed to be also called a compact disc (hereinafter referred to as CD) having a diameter of 12 cm, video data, etc. of moving picture is recorded with a recording capacity which is six times greater or more than that of the existing CD on which audio data is recorded.

On the other hand, the reproducing system of the recording/reproducing system comprises, as shown in FIG. 3, a reproducing head 21 for reproducing a reproduction signal from the recording medium 1, an amplifier 22 for amplifying the reproduction signal from the reproducing head 21, an equalizer (hereinafter referred to as EQ) 23 for equalizing the reproduction signal amplified by the amplifier 22, a clock reproducing element 24 for reproducing a clock from the equalized reproduction signal from the EQ23, a demodulating unit 40 for demodulating the reproduction signal from the EQ23 to reproduce data, an error correcting circuit 25 for carrying out error correction of the data reproduced at the demodulating unit 40, a buffer memory 26 for storing the error corrected data from the error correcting circuit 25, a demultiplexer (hereinafter referred to as DE-MPX) 27 for separating data from the buffer memory 26 into video data and audio data, a decoder 28a for decoding the video data separated at the DE-MPX 27 to reproduce a digital video signal, a D/A converter 29a for converting the digital video signal reproduced at the demodulator 28a to an analog signal to reproduce a video signal, a decoder 28b for decoding the audio data separated at the DE-MPX 27 to reproduce a digital audio signal, and a D/A converter 29b for converting the digital audio signal reproduced at the decoder 28b to an analog signal to reproduce an audio signal.

In operation, the reproducing head 21 reproduces a reproduction signal from the recording medium 1. The amplifier 22 amplifies this reproduction signal. The EQ 23 waveform-equalizes the reproduction signal amplified at the amplifier 22 to deliver the waveform-equalized reproduction signal to the clock reproducing element 24 and the demodulating unit 40. The clock reproducing element 24 is comprised of, e.g., so called PLL (Phase Locked Loop), etc. to reproduce a clock by the clock component included in the reproduction signal.

The demodulating unit 40 binarizes the reproduction signal delivered from EQ 23, e.g., by using a clock delivered from the clock reproducing element 24, and carries out demodulation corresponding to modulation at the above-described modulating unit 30, i.e., converts, in reverse direction, variable length code (d, k; m, n; r) of a basic code length of n bits obtained binarization into data of a basic data length of m bits to reproduce reproduction data.

The error correcting circuit 25 carries out error correction of the reproduction data delivered from the demodulating unit 40. The buffer memory 28 temporarily stores the error corrected reproduction data.

The DE-MPX 27 separates the reproduction data delivered from the buffer memory 26 into video data and audio data to deliver the video data to the demodulator 28a and to deliver audio data to the demodulator 28b.

The demodulator 28a carries out decoding corresponding to coding at the above-described encoder 12a to reproduce a digital video signal. The D/A converter 29a converts the reproduced digital video signal to an analog signal to output a video signal.

The decoder 28b carries out decoding corresponding to coding at the above-described encoder 12b to reproduce a digital audio signal. The D/A converter 29a converts the reproduced digital audio signal to an analog signal to output an audio signal.

The detail of the essential part of the modulating unit 30 will now be described.

The essential part of the modulating unit 30 comprises, as shown in FIG. 1, a shift register 31 for shifting data from the ECC circuit 15 in units of m bits, a rank judging element 32 for judging binding length i (i=1~r) of data delivered in units of m bits from the shift register 31, a data length converter 33 for adding dummy bits to the leading portion of data of m×i bits to form data of m×r bits, a first modulating circuit 34 for forming the dummy bit added data from the data length converter 33 to a code of n×r bits by a first conversion table for converting data of m×r bits where the binding length i is the maximum binding length r, and including at least one conversion table where the binding length i is less than r, a code generator 35 for taking out specific bits from the code from the first modulating circuit 34 on the basis of the binding length i from the rank judging element 32 to output it as a modulation code, a second modulating circuit 38 for converting data of m×i bits which cannot be converted at the first modulating circuit 34 to a variable length code of n×i bits by a second conversion table for converting the binding length i which is not included in the first conversion table and outputting it as a modulation code to the code generator 35, and a shift register 37 for outputting the modulation code from the code generator 35, etc. at a predetermined transfer rate.

When variable length code (d, k; m, n; r) is assumed to be, e.g., variable length code (4, 22; 2, 5; 5), i.e., it is assumed that d which is the minimum run of "0" symbols is 4 bits, k which is the maximum run of "0" symbols is 22 bits, m which is the basic data length is 2 bits, n which is the basic code length is 5 bits, and r which is the maximum binding length is 5, the first modulating circuit 34 comprises a 10–15 conversion table where the binding length i is the maximum binding length 5, including at least one conversion table where the binding length i is less than 5, i.e., three conversion tables; a first conversion table where the binding length i is 2 and for converting data of 4 (=2×2) bits in to a variable length code of 10 (=5×2) bits (hereinafter referred to as 4–10 conversion table), a 8–15 conversion table where the binding length i is 4, and a 8–20 conversion table where the binding length i is 4 as shown in the following Table 1, for example, as the first conversion table. In more practical sense, the 10–25 conversion table may be constituted with, e.g., a so called a ROM in which values of code are stored with data being as address.

It is to be noted that a conversion table where the binding length i is 1, 2, 3, 4 (table of the above-mentioned U.S. Pat. No. 5,400,023) is shown in the table 2. As seen from comparison between the table 1 and the table a 2, a 10–25 conversion table of i=5 shown in the table 1 includes tables except for i=1 of tables of the table 2.

TABLE 1

| DATA | | CODE |
|---|---|---|
| i = 5 | 0000011111 | 01000 01000 01000 01000 00000 |
| | 0000011110 | 01000 01000 01000 00100 00000 |
| | 0000011101 | 01000 01000 01000 00010 00000 |
| | 0000011100 | 01000 01000 01000 00001 00000 |
| | 0000011011 | 01000 01000 00010 00001 00000 |
| | 0000011010 | 01000 01000 00100 00100 00000 |
| | 0000011001 | 01000 01000 00100 00010 00000 |
| | 0000011000 | 01000 01000 00100 00001 00000 |
| | 0000010111 | 01000 01000 00010 00010 00000 |
| | 0000010110 | 01000 00100 00100 00100 00000 |
| | 0000010101 | 01000 00100 00100 00010 00000 |

TABLE 1-continued

| DATA | CODE |
|---|---|
| 0000010100 | 01000 00100 00100 00001 00000 |
| 0000010011 | 01000 00010 00001 00001 00000 |
| 0000010010 | 01000 00100 00001 00001 00000 |
| 0000010001 | 01000 00100 00010 00010 00000 |
| 0000010000 | 01000 00100 00010 00001 00000 |
| 0000001111 | 01000 01000 00001 00001 00000 |
| 0000001110 | 01000 00001 00001 00001 00000 |
| 0000001101 | 01000 00010 00010 00010 00000 |
| 0000001100 | 01000 00010 00010 00001 00000 |
| 0000001011 | 00100 00100 00010 00001 00000 |
| 0000001010 | 00100 00100 00001 00001 00000 |
| 0000001001 | 00100 00010 00010 00010 00000 |
| 0000001000 | 00100 00010 00010 00001 00000 |
| 0000000111 | 00100 00100 00010 00010 00000 |
| 0000000110 | 00100 00100 00100 00100 00000 |
| 0000000101 | 00100 00100 00100 00010 00000 |
| 0000000100 | 00100 00100 00100 00001 00000 |
| 0000000011 | 00100 00001 00001 00001 00000 |
| 0000000010 | 00010 00010 00001 00001 00000 |
| 0000000001 | 00010 00010 00010 00010 00000 |
| 0000000000 | 00010 00010 00010 00010 00000 |
|  | 00010 00001 00001 00001 00000 |
|  | 00001 00001 00001 00001 00000 |
|  | SYNC for mod2to4d5 |
|  | ASYNC 23T 21T 6T |
|  | BSYNC 21T 23T 6T |

TABLE 2

| DATA | | CODE |
|---|---|---|
| i = 1 | 11 | 00000 |
|  | 10 | 10000 |
|  | 111111 | 00001 00001 00000 |
| i = 2 | 0111 | 01000 00000 |
|  | 0110 | 00100 00000 |
|  | 0101 | 00010 00000 |
|  | 0100 | 00001 00000 |
| i = 3 | 001111 | 01000 01000 00000 |
|  | 001110 | 01000 00100 00000 |
|  | 001101 | 01000 00010 00000 |
|  | 001100 | 01000 00001 00000 |
|  | 001011 | 00010 00001 00000 |
|  | 001010 | 00100 00100 00000 |
|  | 001001 | 00100 00010 00000 |
|  | 001000 | 00100 00001 00000 |
|  | 000111 | 00010 00010 00000 |
| i = 4 | 00011011 | 01000 01000 01000 00000 |
|  | 00011010 | 01000 01000 00100 00000 |
|  | 00011001 | 01000 01000 00010 00000 |
|  | 00011000 | 01000 01000 00001 00000 |
|  | 00010111 | 01000 00010 00001 00000 |
|  | 00010110 | 01000 00100 00100 00000 |
|  | 00010101 | 01000 00100 00010 00000 |
|  | 00010100 | 01000 00100 00001 00000 |
|  | 00010011 | 01000 00010 00010 00000 |
|  | 00010010 | 00100 00100 00100 00000 |
|  | 00010001 | 00100 00100 00010 00000 |
|  | 00010000 | 00100 00100 00001 00000 |
|  | 00001111 | 00010 00001 00001 00000 |
|  | 00001101 | 00100 00001 00001 00000 |
|  | 00001101 | 00100 00010 00010 00000 |
|  | 00001100 | 00100 00010 00001 00000 |
|  | 00001011 | 01000 00001 00001 00000 |
|  | 00001010 | 00001 00001 00001 00000 |
|  | 00001001 | 00010 00010 00010 00000 |
|  | 00001000 | 00010 00010 00001 00000 |

Further, the second modulating circuit 36 includes a 2–5 conversion table for converting data of 2 bits where the binding length i is 1, which is not included in the 2–5 conversion table of the first modulating circuit 34 as shown in the following table 3, for example. It is to be noted that in the 2–5 conversion table shown in the Table 3, code rule for converting data of "111111" in binary representation (hereinafter referred to as data "111111") into code "00001 00001 00000" is used for allowing the maximum run K of the variable length code obtained by conversion to be 22 bits or less.

TABLE 3

| DATA | | CODE |
|---|---|---|
| i = 1 | 11 | 00000 |
|  | 10 | 10000 |
|  | 111111 | 000001 00001 00000 |

The shift register 31 shifts data delivered from ECC circuit 15 in units of m bits. The rank judging element 32 judges a binding length i of data delivered in units of m bits. In a more practical sense, the rank judging element 32 judges whether or not data of 2 (m=2) bits delivered exists in the data portion of the 2–5 conversion table shown in the Table 3, i.e., judges the binding length i to be 1 at the time of data "11", "10", and adds the next 2 bits thereto at the time of data "01", "00" so that the total number of bits is 4 (pass on to the next rank). Then, the rank judging element 32 judges whether data caused to be four bits in total corresponds to the lower order 4 bits of the data portion of the 10–25 conversion table shown in the table 2 when the fourth bit from the Least Significant Bit (LSB) is converted to 1, i.e., judges the binding length i to be 2 at the time of data "0111", "0110", "0101", "0100", and passes on to the next rank at the time of data "0011", "0010", "0001", "0000". Similarly, at times subsequent thereto, the rank judging element 32 judges in succession, while adding the next two bits, whether or not data delivered in units of 2 bits from the shift register 31 corresponds to the lower order m×i bits of the data portion of the 10–25 conversion table shown in table 2 when those specific bits are converted to judge the binding length i=3~5.

Further, the rank judging element 32 is operative so that when the binding length i is 1, it delivers data of m×i bits, i.e., data of "11", "10" of 2 bits and data "111111" to the second modulating circuit 36, and when the binding length i is 2~5, it delivers m×i (i=2~5) bits, i.e., data of 4~10 bits to the data length converter 33.

Figure 4:
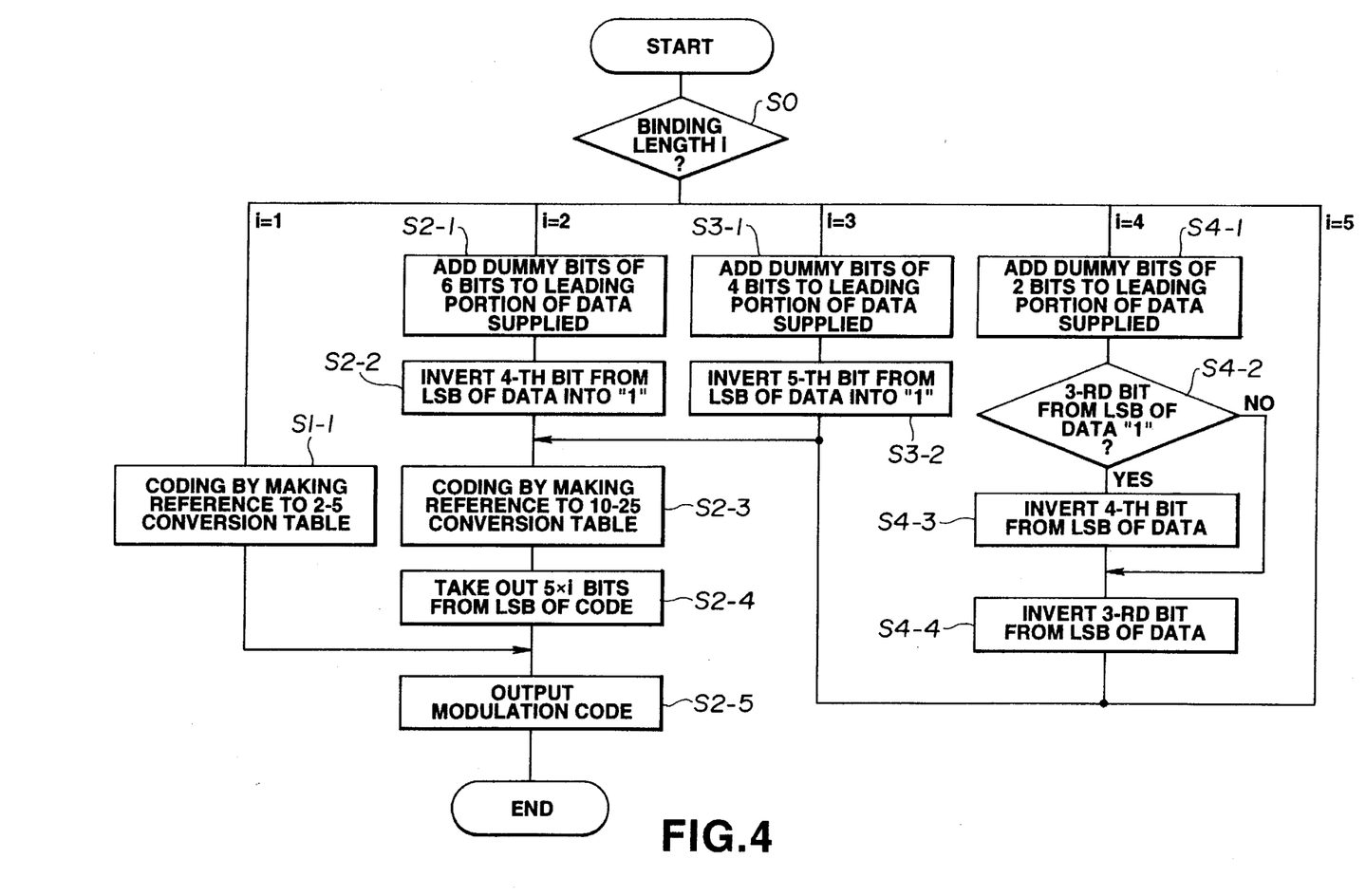
FIG. 4 is a flowchart showing a modulating operation.

The data length converter 33 adds dummy bits to the leading portion of m×i (i≠r) bits delivered from the rank judging element 32 to form m×r bits, and converts a portion of the data so as to become in correspondence with the data portion of the 10–25 conversion table. The flowchart of the operation of data length converter 33, first and second modulators 34, 36 and code generator 35 is shown in FIG. 4.

In a more practical sense, the data length converter 33 is operative so that when the binding length i is, e.g., 2, i.e., data delivered from the rank judging element 32 is 4 (=2×2) bits, it adds dummy bits of 8 bits indicated by "000001" to the leading portion thereof to form data of 10 (=2×5) bits which is the same as that of the data portion of the 10–25 conversion table (step S2-1), and converts the fourth bit from LSB of the data thus formed into "1" so as to become in correspondence with the data portion of the 10–25 conversion table (step S2-2). As a result, e.g., data "0111" delivered from the rank judging element 32 is converted into data "0000011111", and e.g., data "0110" is converted into data "0000011110".

Further, the data length converter 33 is operative so that if the binding length i is, e.g., 3, i.e., data is 6 bits, it adds dummy bits of 4 bits indicated by "0000" to the leading portion thereof to form data of 10 bits which is the same as that of the data portion of the 10–25 conversion table (step S3-1), and converts the fifth bit from LSB of the data thus formed into "1" so as to become in correspondence with the data portion of the 10–25 conversion table (step S3-2). As a result, e.g., data "001111" delivered from the rank judging element 32 is converted into data "0000011111", and data "001110" is converted into data "0000011110". In addition, the data length converter 33 is operative so that when the binding length i is, e.g., 4, it adds dummy bits "00" of 2 bits to the leading portion thereof (step S4-1), and converts specific bits so that the data thus formed becomes in correspondence with the data portion of the 10–25 conversion table. Namely, in the case of i=4, only when the third bit from LSB is "1" (step S4-2), data of the fourth bit from LSB is first caused to undergo processing such that "1" is exchanged into "0" and "0" is exchanged into "1" (step S4-3). Then, data of the third bit from LSB is exchanged (step S4-4). For example, data "00011011" is converted into data "0000011111", and data "00010111" is converted into data "0000011011".

The first modulator 34 includes 10–25 conversion table shown in the table 1, and is operative to read out codes of the code portion with data delivered from the data length converter 33 being as readout address (step S2-3). As a result, when data delivered from data length converter 33 is, e.g., "0000011111", code "01000 01000 01000 01000 00000" is outputted from the first modulator 34. Namely, when e.g., data "0111" (i=2), data "001111" (i=3), data "00011011" (i=4), data "0000011111" (i=5) are delivered to this modulator 30, a code "01000 01000 01000 01000 00000" of 25 (=5×5) bits is uniformly outputted from the first modulator 34 by the 10–25 conversion table for converting data of 10 (=2×5) bits where the binding length i is the maximum binding length 5. Further, when e.g., data "0110", "01110", "00011010", "0000011110" are delivered, code "01000 01000 01000 00100 00000" of 25 bits is uniformly outputted from the first modulator 34 by the 10–25 conversion table.

The code generator 35 takes out specific bits of the code of 25 bits, i.e., n×i bits from LSB delivered from the first modulator 34 on the basis of the binding length i delivered from the above-described rank judging element 32 (step S2-4) to output it as a modulation code (step S2-5). In actual terms, for example, when code "01000 01000 01000 01000 00000" is delivered from the first modulator 34 and 2 is delivered as the binding length i from the rank judging element 32, the code generator 35 outputs a modulation code "01000 00000" of 10 (=5×2) bits. Further, when 3 is delivered as the binding length i, the code generator 35 outputs a modulation code "01000 01000 00000" of 15 (=5×3) bits. When 4 is delivered as the binding length i, the code generator 35 outputs a modulation code "01000 01000 01000 01000 0000" of 20 (=5×4) bits. When 5 is delivered as the binding length i, the code generator 35 outputs a modulation code "01000 01000 01000 01000 00000" of 25 (=5×5) bits. Further, in the case where, e.g., code "01000 01000 01000 00100 00000" is delivered, when the binding length i is 2, the code generator 35 outputs a modulation code "00100 00000"; when the binding length i is 3, it outputs a modulation code "01000 00100 00000"; and when the binding length i is 4, it outputs a modulation code "01000 01000 00100 00000", and when the binding length i is 5, it outputs a modulation code "01000 01000 01000 00100 00000". Modulation codes having code lengths of n×i bits based on the binding length i thus obtained are delivered to shift register 37, and are then delivered from the shift register 37 to, e.g., a NRZI modulator (not shown) at a predetermined transfer rate. The NRZI modulated modulation code is sent to the recording head 16.

On the other hand, the second modulator 38 converts data of 2 (=2×1) bits which cannot be converted at the first modulator 34 into a variable length code of 5 (=5×1) bits by the 2–5 conversion table for converting data where the binding length i is i which is not included in the above-described 10–25 conversion table to deliver the variable length code thus obtained to the recording head 16 through code generator 35, shift register 37, and NRZI modulator.

Thus, this modulating apparatus 30 can convert data of 4 bits, 6 bits, 8 bits and 10 bits into variable length codes of 10 bits, 15 bits, 20 bits and 25 bits only by the 10–25 conversion table of the first modulator 34. As a result, the 4–10 conversion table, the 6–15 conversion table and the 8–20 which were required in the conventional device are unnecessary.

The recording head 18 carries out recording with respect to the recording medium i comprised of, e.g., a magneto-optical disc on the basis of the NRZI modulated modulation code delivered from the modulator 30 as described above. As a result, when the bit interval of data delivered to the modulator 30 is assumed to be T, the minimum pit length formed on the recording medium 1, i.e., the minimum reversal interval $T_{min}$ is 2.0 (=(2/5)×5)T. Namely, the minimum reversal interval $T_{min}$ can be caused to be greater as compared to, e.g., so called EFM ($T_{min}$=1.41T) or (2, 7) modulation ($T_{min}$=0.5T), etc., and conversion tables conventionally required every binding length i, i.e., 68 code rules conventionally required can be reduced to 35 code rules as shown in the tables 1, 3. Thus, the circuit scale of the first modulator 34 can become compact.

The detail of the essential part of the demodulating apparatus 40 will now be described.

The demodulating apparatus includes, as the essential components, as shown in FIG. 2, a shift register 41 for shifting a variable length code obtained by binarizing a reproduction signal equalized by the EQ23 in units of n bits, a rank judging element 42 for judging binding length i (i=1~r) of a variable length code delivered in units of n bits from the shift register 41, a code length converter 43 for adding dummy bits to the leading portion of the variable length code of n×i bits to form a code of n×r bits, a first demodulator 44 by uniformly converting, in reverse direction, the code of n×r bits from the code length converter 43 to data of m×r bits by using a first reverse conversion table for converting, in reverse direction, code of n×r bits where the binding length i is the maximum binding length r, and including at least one reverse conversion table where the binding length i is less than r, a data generator 45 for taking out specific bits from data from the first demodulator 44 on the basis of the binding length i from the rank judging element 42 to output them as reproduction data, a second demodulator 46 for converting, in reverse direction, the variable length code of n×i bits which cannot be converted in reverse direction at the first demodulator 44 into data of m×i bits by the second reverse conversion table for converting in reverse direction variable length code of binding length i which is not included in the first reverse conversion table to output it as reproduction data, and a shift register 47 for outputting, at a predetermined transfer rate, the reproduction data from the data generator 45, etc.

Assuming now that the variable length code (d, k; m, n; r) is, e.g., (4, 22; 2, 5; 5) where the minimum run d is 4 bits, the maximum run k is 22 bits, the basic data length m is 2 bits, the basic code length n is 5 bits, and the maximum binding length r is 5, the first demodulator 44 includes, as the first reverse conversion table, a reverse conversion table corresponding to the 10–25 conversion table that the above-described first modulator 34 has, i.e., at least one reverse conversion table where the code portion of the above-described 10–25 conversion table shown in FIG. 1 is taken as a readout address and the data portion thereof is taken as an output, i.e., a 25–10 reverse conversion table including three conversion tables of a reverse conversion table of a binding length i of 2 and for converting in reverse direction a variable length code of 10 (=5×2) bits into data of 4 (=2×2) bits (hereinafter referred to as 10–4 reverse conversion table), a 15–6 reverse conversion table of a binding length of 3, and a 10–8 reverse conversion table of a binding length i of 4.

Further, the second demodulator 46 includes, as a second reverse conversion table, a reverse conversion table for converting in reverse direction a variable length code of 5 bits where the binding length i is 1 which is not included in the 25–10 reverse conversion table of the first demodulator 44, i.e., a 5–2 reverse conversion table where the code portion of the 2–5 conversion table (shown in Table 3) that the above-described second demodulator 36 has is taken as a readout address and the data portion thereof is as an output.

In operation, the shift register 41 shifts the reproduced variable length code in units of n bits. The rank judging element 42 judges the binding length i of the variable length code delivered in units of n bits. In a more practical sense, the rank judging element 42 is operative so that when 5 bits of one unit delivered in units of 5 (n=5) bits from the leading portion are all "0" symbols, it judges that the variable length code has a boundary. When the number of bits from a boundary to the next boundary is 5, it judges the binding length i to be 1; when that number is 10, it judges the binding length i to be 2; when that number is 15, it judges the binding length i to be 3; when that number is 20, it judges the binding length i to be 4; and when that number is 25, it judges the binding length i to be 5. It is to be noted that binding length i is judged to be 1 with respect to the variable length code "00001 00001 00000".

When the binding length i is 1, the rank judging element 42 delivers, to the second demodulator 46, n×1 bits i.e., variable length codes "00000", "10000" of 5 bits and variable length code "00001 00001 00000", and when the binding length i is 2–5, the rank judging element 42 delivers, to the code length converter 43, variable length code of n×i (i=2~5) bits, i.e., 10–25 bits.

The code length converter 43 adds dummy bits to the leading portion of n×i (i≠r) bits delivered from the rank judging element 43 to form a code of n×r bits to deliver a code of n×r bits to the first demodulator 44.

Figure 5:
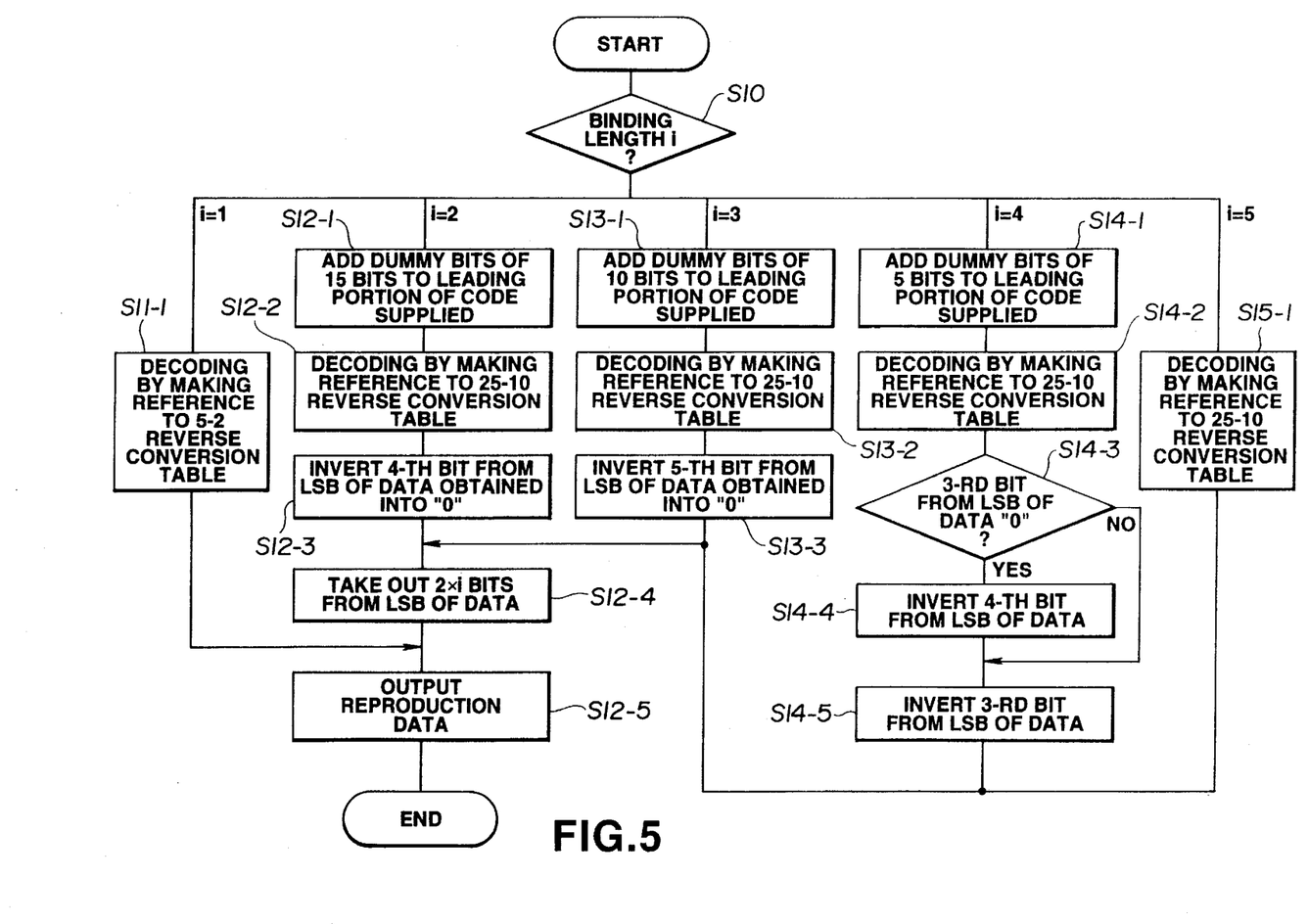
FIG. 5 is a flowchart showing a demodulating operation.

The flowchart of the operation in the code length converter 43, and first and second demodulators 44, 46, and the data generator 45 is shown in FIG. 5.

In a more practical sense, when the binding length i is 2, i.e., variable length code delivered from rank judging element 2 is 10 (=5×2) bits, the code length converter 43 adds dummy bits of 15 bits indicated by "01000 01000 01000" to the leading portion thereof to form a code of 25 (=5×5) bits which is the same as the code portion of the 25–10 reverse conversion table (step S12-1).

When the binding length i is, e.g., 3, i.e., the variable length code is 15 bits, the code length converter 43 adds dummy bits of 10 bits indicated by "01000 01000" to the leading portion thereof to form a code of 25 bits which is the same as that of the code portion of the 25–10 reverse conversion table (step S13-1). Similarly, when the binding length i is 4, the code length converter 43 adds dummy bits "01000" of 5 bits to the leading portion thereof (step S14-1). As a result, e.g., variable length codes "01000 00000" (i=2), "01000 01000 00000" (i=3), "01000 01000 01000 0000" (i=4) delivered from the rank judge element 42 are all converted into code "01000 01000 01000 01000 0000". Further, e.g., variable length codes "00100 00000" (i=2), "01000 00100 00000" (i=3), "01000 01000 00100 00000" (i=4) are all converted into code "01000 01000 01000 00100 00000" Codes uniformly converted into 25 bits are delivered to the first demodulator 44.

The first demodulator 44 includes, as described above, a 25–10 reverse conversion table for outputting data portion of the 10–25 conversion table shown in the table 1 with the code portion thereof being as a readout address, and serves to read out data of the data portion with a code of 25 bits delivered from the code length converter 43 being as a readout address (steps S12-2, S13-2, S14-2, S15-1). As a result, when code delivered from the code length converter 43 is "01000 01000 01000 01000 00000", data "0000011111" is outputted from the first demodulator 44. Namely, when, e.g., variable length codes "01000 00000" (i=2), "01000 01000 00000" (i=3), "01000 01000 01000 00000" (i=4), and "01000 01000 01000 01000 00000" (i=5) are delivered to the demodulating apparatus 40, data "0000011111" of 10 (=2×5) bits are uniformly outputted from the first demodulator 44 by the 25–10 reverse conversion table for converting in reverse direction a variable length code of 25 (=5×5) bits where the binding length i is the maximum binding length 5. Further, when, e.g., variable length codes "00100 00000", "01000 00100 00000", "01000 01000 00100 00000", and "01000 01000 01000 00100 00000" are delivered, data "00000 11110" of 10 bits are uniformly outputted from the first demodulator 44 by the 25–10 reverse conversion table.

The data generator 45 takes out specific bits of data of 10 bits, i.e., m×i bits from LSB delivered from the first demodulator 44 on the basis of the binding length i delivered from the above-described rank judging element 42, and converts the specific bits of the data thus taken out to output them as reproduction data.

In more practical sense, when, e.g., data "0000011111" is delivered from the first demodulator 44 and 2 is delivered as the binding length i from the rank judging element 42, the data generator 45 takes out 4 bits from LSB (step S12-4), and converts the fourth bit from LSB to "0" (step S12-3) to output "0111" as reproduction data. Further, when 3 is delivered as the binding length i with respect to the same data "0000011111", the data generator 45 takes out 6 bits from LSB (step S12-4), and converts the fifth bits from LSB to "0" (step S13-3) to output "001111" as reproduction data. Further, when the same data "0000011111" is delivered and 4 is delivered as the binding length i, the data generator 45 outputs reproduction data "0011011". When 5 is delivered as the binding length i, the data generator 45 outputs reproduction data "0000011111" (step S15-1). Namely, in the case of i=4, the data generator 45 takes out 8 bits from LSB. Then, whether or not the third bit from LSB of the 8 bit data is "0" is judged (step S14-3). In the case of "0", after the fourth bit from LSB of the 8 bit data is inverted (step S14-4), the third bit from LSB is inverted (step S14-5). When the third bit from LSB is "1", only the third bit is inverted into "0" (step S14-5). It is to be noted that while, in this case, 8 bit data is taken out from 10 bits from the demodulator 44 thereafter to convert data, data is converted thereafter to take out 8 bits (This similarly applies to other binding lengths). In FIG. 5, the latter approach was adopted.

Further, when, e.g., data "0000011110" are delivered and 2, 3, 4, 5 are respectively delivered as the binding length i, the data generator 45 respectively outputs reproduction data "0110", "001110", "0011010", "0000011110".

Reproduction data having a data length (m×i bits) based on the binding length i obtained in this way is delivered to the shift register 47. This data is delivered from the shift register 47 to the above-described error correcting circuit 25 at a predetermined transfer rate (step S12-5).

On the other hand, the second demodulator 46 converts, in reverse direction, variable length code of 5 (=5×1) bits which cannot be converted in reverse direction at the first demodulator 44 to data of 2 (=2×1) bits by using the 5–2 reverse conversion table for converting, in reverse direction, variable length code having binding length i of 1 which is not included in the above-described 25–10 reverse conversion table (step S11-1) to deliver reproduction data thus obtained to the error correcting circuit 25 through data generator 45 and shift register 47 (step S12-5).

Thus, this demodulating apparatus 40 can convert, in reverse direction, variable length codes of 10 bits, 15 bits, 20 bits and 25 bits into data of 4 bits, 6 bits, 8 bits and 10 bits only by the 25–10 reverse conversion table of the first demodulator 44. As a result, 10–4 reverse conversion table, 15–6 reverse conversion table, and 10–8 reverse conversion table which were required in the conventional apparatus are not necessary. In other words, reverse conversion tables which were required for every binding length i in the prior art can be reduced, i.e., 68 code rules which were required in the prior art can be reduced to 35 code rules. Thus, the circuit scale of the first demodulator 44 can become compact.

It should be noted that the variable length code employed in this invention is not limited to the variable length code (4, 22; 2, 5; 5) of the above-described embodiment, but may be applied to, e.g., the variable length code (d, k; m, n; r) where r is not 1.

As is clear from the foregoing, the demodulator according to this invention judges the binding length i (i=1~r) in the variable length code (d, k; m, n; r) to uniformly convert data of m×i bits to a code of n×r bits by a first conversion table for converting data of m×r bits where the binding length i is the maximum binding length r, and including at least one conversion table where the binding length i is less than r to take out specific bits from this code on the basis of the binding length i to output them as a modulation code, and to convert data of m×i bits which cannot be converted by the first conversion table into a variable length code of n×i bits by the second conversion table to output it as a modulation code, thereby making it possible to reduce the number of conversion tables which where required for every binding length i in the conventional apparatus to allow the circuit scale to become compact, and to reduce the cost.

Further, the demodulating apparatus according to this invention judges the binding length i of the variable length code to uniformly convert, in reverse direction, a variable length code of n×i bits into data of m×r bits by a first reverse conversion table for converting, in reverse direction, variable length code of n×r bits where the binding length i is the maximum binding length r, and including at least one reverse conversion table where the binding length i is less than r to take out specific bits from the data on the basis of the binding length i to output them as reproduction data, and to convert, in reverse direction, variable length code of n×i bits which cannot be converted in reverse direction by the first conversion table into data of m×i bits by the second reverse conversion table to output it as reproduction data, thereby making it possible to reduce the number of conversion tables which were required for every binding length i in the conventional apparatus and thus to allow the circuit scale to become compact and to reduce the cost.

What is claimed is:

1. A modulating method for converting data of a basic data length of m bits into a variable length code of a basic code length of n bits (d, k; m, n; r), comprising:

a judging step of judging a binding length i (i=1~r) of the basic data;

a modulating step of uniformly converting data of m×i bits into a code of n×r bits by a conversion table for converting data of m×r bits where the binding length i is the maximum binding length r, and including at least one conversion table where the binding length i is less than r; and a code generating step of taking out n×i bits from the least significant bit from the code of n×r bits obtained at the modulating step on the basis of the binding length i obtained at the judging step to output them as a modulation code.

2. A modulating method as set forth in claim 1, wherein the modulating step includes a data conversion step for converting a portion of the data so as to become in correspondence with the data portion of the conversion table in converting data where the binding length i is less than r at the modulating step.

3. A modulating method as set forth in claim 2, wherein the variable length code (d, k; m, n; r) is such that the minimum run d of "0" is 4 or more.

4. A modulating method as set forth in claim 3, wherein the variable length code (d, k; m, n; r) is such that the maximum run k of "0" is 22 or less.

5. A demodulating method for converting, in reverse direction, variable length code (d, k; m, n; r) of a basic code length of n bits into data of a basic data length of m bits, comprising:

a judging step of judging the binding length i of the variable length code;

a demodulating step of converting, in reverse direction, a variable length code of n×i bits to data of m×r bits by a reverse conversion table for converting in reverse direction a variable length code of n×r bits where the binding length i is the maximum binding length r, and including at least one reverse conversion table where the binding length i is less than r; and a data generating step of taking out m×i bits from the least significant bit from the data of m×r bits obtained at the demodulating step on the basis of the binding length i obtained at the judging step to output them as reproduction data.

6. A demodulating method as set forth in claim 1, wherein, at the judging step, a variable length code train is partitioned from the leading portion thereof in units of n bits, whereby when n bits of one unit are all "0", it is judged that there is a boundary of the variable length code to judge the binding length i.

7. A demodulating method as set forth in claim 6, wherein after a variable length code where the binding length i is less than r is converted in reverse direction at the demodulating step, specific bits of the data of m×i bits thus taken out are converted into reproduction data.

8. A modulating apparatus for converting data of a basic data length of m bits into a variable length code (d, k; m, n; r) of a basic code length of n bits, comprising:

judging means for judging a binding length i (i=1~r) of the data;

first modulating means for uniformly converting data of m×i bits into a code of n×r bits by a first conversion table for converting data of m×r bits where the binding length i is the maximum binding length r, and including at least one conversion table where the binding length i is less than r;

code generating means for taking out n×i bits from the least significant bit from the code of n×r bits obtained from the first modulating means on the basis of the binding length i from the judging means to output them as a modulation code; and second modulating means for converting data of m×i bits which cannot be converted by the first modulating means into a variable length code of n×i bits by a second conversion table for converting data of the binding length which is not included in the first conversion table to output it as a modulation code.

9. A modulating apparatus as set forth in claim 8, which further comprises data converting means for converting a portion of the data so as to become in correspondence with the data portion of the first conversion table in converting data where the binding length i is less than r.

10. A modulating apparatus as set forth in claim 9, wherein the variable length code (d, k; m, n; r) is such that the minimum run d of "0" is 4 or more.

11. A modulating apparatus as set forth in claim 9, wherein the variable length code (d, k; m, n; r) is such that the maximum run k of "0" is 22 or less.

12. A demodulating apparatus as set forth in claim 11, wherein the judging means is adapted to partition a variable length code train in units of n bits from the leading portion thereof, whereby when n bits of one unit are all 0, it is judged that there is a boundary of the variable length code to judge the binding length i.

13. A demodulating apparatus for converting, in reverse direction, a variable length code (d, k; m, n; r) of a basic code length of n bits into data of a basic data length of m bits, comprising:

judging means for judging a binding length i (i=1~r) of data;

first demodulating means for uniformly converting, in reverse direction, a variable length code of n×i bits into data of m×r bits by a reverse conversion table for converting, in reverse direction, a variable length code of n×r bits where the binding length i is the maximum binding length r, and including at least one reverse conversion table where the binding length i is less than r;

data generating means for taking out m×i bits from the least significant bit from the data of m×r bits obtained from the first demodulating means on the basis of the binding length i from the judging means to output them as reproduction data; and second demodulating means for converting, in reverse direction, a variable length code of n×i bits which cannot be converted in reverse direction by the first demodulating means into data of m×i bits by a second reverse conversion table for converting, in reverse direction, a variable length code of the binding length i, which is not included in the first conversion table, thus to output it as reproduction data.

14. A demodulating apparatus as set forth in claim 13, wherein in converting, in reverse direction, a variable length code where the binding length i is less than r, the data generating means converts specific bits of data of n×i bits which have been taken out to take it as reproduction data.

* * * * *